Nov. 24, 1964 M. W. BROOKSBY 3,158,813

PULSE-FORMING CIRCUITS INCLUDING A PLURALITY OF TRANSMISSION LINES

Filed Jan. 11, 1963

INVENTOR
MERRILL W. BROOKSBY

BY J. C. Chapman
ATTORNEY

United States Patent Office 3,158,813
Patented Nov. 24, 1964

3,158,813

PULSE-FORMING CIRCUITS INCLUDING A PLURALITY OF TRANSMISSION LINES

Merrill W. Brooksby, Cupertino, Calif., assignor to Hewlett-Packard Company, Palo Alto, Calif., a corporation of California Filed Jan. 11, 1963, Ser. No. 250,850
7 Claims. (Cl. 328—56)

This invention relates to a circuit for producing high energy pulses at extremely high repetition rates and more particularly to a circuit which produces high power output pulses from an applied high frequency signal.

It is a principal object of the present invention to provide an improved pulse-forming circuit which operates at frequencies up to several hundred megacycles per second.

In accordance with a preferred embodiment of the invention, a trigger circuit of the type known as a Schmitt trigger is connected to receive applied signals and has each of its outputs connected to an input of a differential amplifier. The outputs of the amplifier are combined and differentiated using a system of transmission lines.

Figure 1:
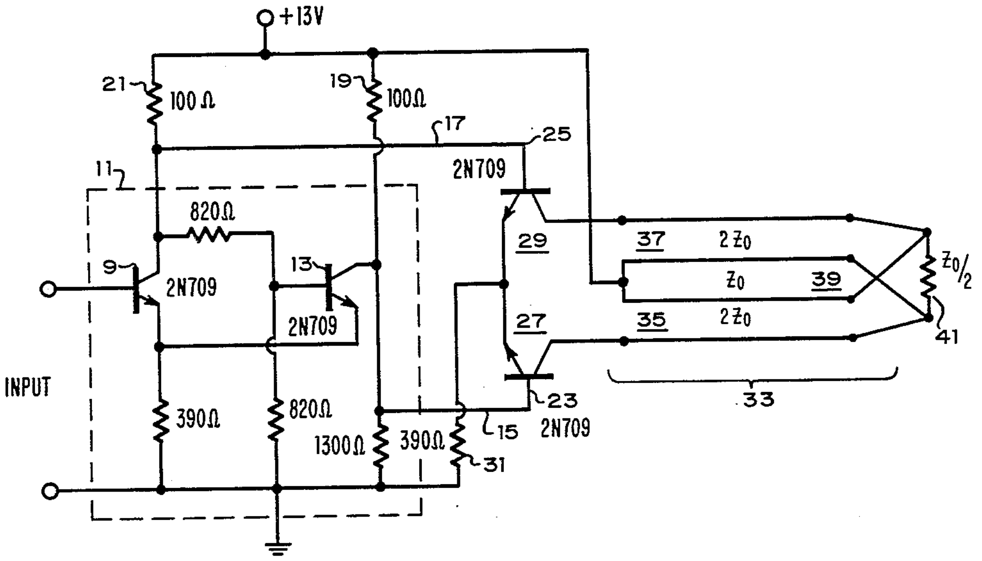
Figure 2:
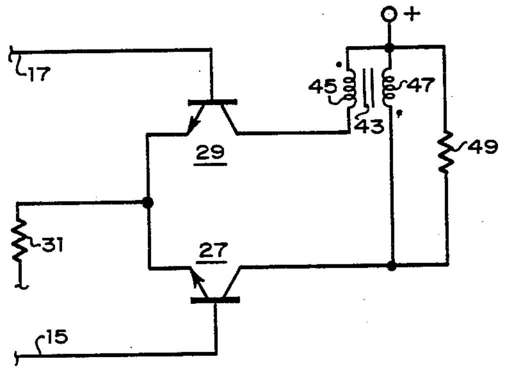

For an understanding of the principles of the invention, reference is made to the following description of the invention as illustrated in the accompanying drawing in which:

FIGURE 1 shows a schematic diagram of a preferred embodiment of the pulse-forming circuit, and FIGURE 2 is a schematic diagram of the pulse-forming circuit for use in lower frequency applications.

Referring to the circuit of FIGURE 1, input signal is applied to transistor 9 of trigger circuit 11. Transistors 9 and 13 are connected to be alternately conductive and nonconductive in opposite phase relationship. Each time the signal at the input of trigger circuit 11 passes in one direction through a reference level, transistor 9 becomes conductive producing an output pulse on line 17 and causing transistor 13 to become nonconductive, thereby producing an output pulse of opposite polarity on line 15. Each time the input signal passes in the opposite direction through the reference level transistor 13 becomes conductive producing an output pulse on line 15 and causing transistor 9 to become nonconductive, thereby producing an output pulse of opposite polarity on line 17. Thus, for alternating signal applied to the input of trigger circuit 11, pulses of given polarity appear alternately on lines 15 and 17. These pulses appear across resistors 19 and 21 and are applied to the base electrodes 23 and 25 of transistors 27 and 29. The commonly connected emitter electrodes of these transistors are connected to ground through resistor 31. The collector electrodes of the transistors 27 and 29 are connected to the inputs to the system of transmission lines 33. These transmission lines are substantially lossless devices which provide impedance transformation between inputs and output over a specified range of frequencies above D.C. Current steps of equal amplitude and opposite direction are supplied from these collector electrodes to the lines 35 and 37. This produces voltage steps of opposite polarities which propagate toward the load 41. The ends of the transmission lines 35 and 37 remote from the input ends are so connected that these voltage steps are combined in parallel across the load 41. The characteristic impedance of each of the lines 35 and 37 is chosen to be four times the impedance of the load 41 and twice the characteristic impedance of line 39. Because of the impedance mismatch which these original or incident propagating waves encounter at the load, reflected waves are produced. These waves are of opposite polarity and are one-half the amplitude of the original or incident wave and are reflected back down lines 35 and 37. At the same time a wave of the same polarity and of one half the amplitude of the original or incident wave propagates down line 39. Also at the same time, a voltage having an amplitude of one-half of the original or incident wave appears across load 41.

The waves appearing on lines 35, 37 and 39 at the ends remote from the input ends of the lines all propagate with uniform velocity toward the input ends. The voltage of one-half the amplitude of the original or incident wave is maintained across load 41 during the propagation times of the reflected waves on lines 35, 37 and 39. When the wave on line 39 reaches the shorted end, a wave of opposite polarity and of equal amplitude is reflected back toward load 41. At the same time the reflected waves in lines 35 and 37 reach the input end, which ends appear as open circuits because of the relatively high collector impedances of transistors 27 and 29. As a result, a wave appears on each of lines 35 and 37 which is reflected back toward load 41 and which has the same polarity and twice the amplitude of the wave which was reflected from the load 41 toward the input ends. In other words, these second reflected waves on lines 35 and 37 are equal in amplitude and opposite in polarity to the original or incident waves. When these second reflected waves on lines 35 and 37 and the reflected wave on line 39 simultaneously reach load 41, the original or incident waves are cancelled and the output voltage across the load 41 goes to zero. The voltage wave on line 39 reflected back from the shorted end prohibits further reflections in the transmission lines. The duration of the output pulse is thus twice the propagation time of the lines 35, 37 and 39, which propagation time is established by the length of the lines. The rise and fall times of the output pulse across load 41 are thus equal to the rise time of the applied current steps. For the impedance relationships as shown, the collector-to-collector impedance presented by the transmission lines 33 to the transistors 27 and 29 is eight times the impedance of load 41 for the duration of the pulse and is zero thereafter. Also for the impedance relationships as shown overshoot, undershoot, pulse sag and ringing of the leading and trailing edges are thus eliminated. These transmission lines therefore provide pulse shaping in addition to impedance transformation for the duration of the pulse.

FIGURE 2 shows a circuit for use in lower frequency applications and which uses another type of electromagnetic induction apparatus, namely transformer 43, in the output stage. This transformer has a pair of windings 45 and 47 which have dot-polarity markings as shown and which are so connected that current pulses of opposite polarity applied thereto combine to increase the total magnetic flux in the transformer. A load 49 connected across one winding 47 is reflected into the circuit connected to the other winding 45 and thus serves as the load for each of transistors 27 and 29. The pulse power available from each of the outputs of the trigger circuit 11 is thus combined in transformer 43 and is delivered to the load 49. It can be seen that a differential transformer having a center-tapped primary winding connected to the collector electrodes of transistors 27 and 29 and having the secondary winding connected to the load 49 may also be used in place of the transmission lines 33 in lower frequency applications. A transformer thus connected combines the differential pulses from the transistors 27 and 29 and matches the impedances of the load 49 and the driving circuit.

I claim:

1. A pulse-forming circuit comprising:

a trigger circuit having a pair of outputs and being operative only in either one of two operating states;

means to apply signal to said trigger circuit to produce changes in the operating states thereof;

said trigger circuit producing signals in phase opposition at the outputs thereof in response to changes in the operating states thereof;
a pair of transmission lines each having an input end and an output end;
means connecting the outputs of said trigger circuit to the inputs of said transmission lines;
a utilization circuit;
means connecting the output ends of said lines in parallel across said utilization circuit for applying the signals appearing at the input ends of the transmission lines to said utilization circuit in in-phase relationship;
another transmission line having an input end and a shorted end remote from said input end;
and means connecting the input end of said other transmission line across said utilization circuit.

2. A pulse-forming circuit comprising:
a trigger circuit having a pair of outputs and being operative only in either one of two operating states;
means to apply signal to said trigger circuit to produce changes in the operating states thereof;
said trigger circuit producing signals in phase opposition at the outputs thereof in response to changes in the operating states thereof;
a pair of transmission lines each having an input end and an output end;
means connecting the outputs of said trigger circuit to inputs of said transmission lines;
a utilization circuit;
means connecting the output ends of said lines in parallel across said utilization circuit for applying the signals appearing at the input ends of the transmission lines to said utilization circuit in in-phase relationship;
another transmission line including a conductor from each of said pair of transmission lines and having an input end and a shorted end remote from said input end;
and means connecting the input end of said other transmission line across said utilization circuit.

3. In a pulse-forming circuit:
a plurality of conductors forming at least a pair of transmission lines, each of said lines having an input end and an output end;
means to apply signals to the input ends of said transmission lines in phase opposition;
a utilization circuit;
means connecting the output ends of said lines in parallel across said utilization circuit for applying the signals appearing at the input ends of the transmission lines to said utilization circuit in in-phase relationship;
another transmission line having an input end and a shorted end remote from said input end;
and means connecting the input end of said other transmission line across said utilization circuit.

4. In a pulse-forming circuit:
a plurality of conductors forming at least a pair of transmission lines, each of said lines having an input end and an output end;
means to apply signals to the input ends of said transmission lines in phase opposition;
a utilization circuit;
means connecting the output ends of said lines in parallel across said utilization circuit for applying the signals appearing at the input ends of the transmission lines to said utilization circuit in in-phase relationship;
another transmission line including a conductor of each of said transmission lines and having an input end and a shorted end remote from said input end;
and means connecting the input end of said other transmission line across said utilization circuit.

5. In a pulse-forming circuit;
a plurality of conductors forming at least a pair of transmission lines, each of said lines having an input end and an output end;
means to apply signals to the input ends of said transmission lines in phase opposition;
a utilization circuit;
means connecting the output ends of said lines in parallel across said utilization circuit for applying the signals appearing at the input ends of the transmission lines to said utilization circuit in in-phase relationship;
another transmission line including a conductor of each of said transmission lines;
said other transmission line having a characteristic impedance which is less than the characteristic impedance of each of said pair of transmission lines and having an input end and a shorted end remote from said input end;
and means connecting the input end of said other transmission line across said utilization circuit.

6. In a pulse-forming circuit:
a plurality of conductors forming at least a pair of transmission lines, each of said lines having an input end and an output end;
means to apply signals to the input ends of said transmission lines in phase opposition;
a utilization circuit;
means connecting the output ends of said lines in parallel across said utilization circuit for applying the signals appearing at the input ends of the transmission lines to said utilization circuit in in-phase relationship;
another transmission line including a conductor of each of said transmission lines;
said other transmission line having a characteristic impedance which is twice the impedance of said utilization circuit and having an input end and a shorted end remote from said input end,
the characteristic impedance of each of said pair of transmission lines being twice the characteristic impedance of said other transmission line;
and means connecting the input end of said other transmission line across said utilization circuit.

7. In a pulse-forming circuit:
a plurality of conductors forming at least a pair of transmission lines, each of said lines having an input end and an output end;
means to apply signals to the input ends of said transmission lines in phase opposition;
a utilization circuit;
means connecting the output ends of said lines in parallel across said utilization circuit for applying the signals appearing at the input ends of the transmission lines to said utilization circuit in in-phase relationship;
another transmission line including a conductor of each of said pair of transmission lines and having an input end and a shorted end remote from said input end;
each of said pair of transmission lines and said other transmission line having the same propagation delay time;
and means connecting the input end of said other transmission line across said utilization circuit.

References Cited by the Examiner

UNITED STATES PATENTS

| | | | |
|---|---|---|---|
| 2,966,640 | 12/60 | Eiland | 333—26 |
| 3,031,588 | 4/62 | Hilsenrath | 307—88.5 |
| 3,096,445 | 7/63 | Herzog | 307—88.5 |

ARTHUR GAUSS, *Primary Examiner.*